United States Patent
Oka et al.

(10) Patent No.: US 7,211,883 B2
(45) Date of Patent: *May 1, 2007

(54) SEMICONDUCTOR CHIP PACKAGE

(75) Inventors: Takahiro Oka, Tokyo (JP); Makoto Terui, Yamanashi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 50 days.

This patent is subject to a terminal disclaimer.

(21) Appl. No.: 11/128,306

(22) Filed: May 13, 2005

(65) Prior Publication Data

US 2005/0212108 A1    Sep. 29, 2005

Related U.S. Application Data

(63) Continuation of application No. 09/912,064, filed on Jul. 25, 2001.

(30) Foreign Application Priority Data

Feb. 2, 2001    (JP)    ................................. 2001-26898

(51) Int. Cl.
*H01L 23/02*    (2006.01)
(52) U.S. Cl. ...................... 257/678; 257/686; 257/777; 257/676; 257/724; 257/672; 257/690; 257/787
(58) Field of Classification Search ................ 257/678, 257/679, 677, 681, 686, 687, 688, 773, 776, 257/778
See application file for complete search history.

(56) References Cited

U.S. PATENT DOCUMENTS

| | | | |
|---|---|---|---|
| 5,523,608 A | 6/1996 | Kitaoka et al. | |
| 6,072,233 A * | 6/2000 | Corisis et al. | 257/686 |
| 6,077,724 A | 6/2000 | Chen | |
| 6,118,176 A * | 9/2000 | Tao et al. | 257/676 |
| 6,118,184 A | 9/2000 | Ishio et al. | |
| 6,133,067 A * | 10/2000 | Jeng et al. | 438/110 |
| 6,201,302 B1 | 3/2001 | Tzu | |
| 6,268,648 B1 | 7/2001 | Fukutomi et al. | |
| 6,297,547 B1 * | 10/2001 | Akram | 257/676 |
| 6,414,381 B1 | 7/2002 | Takeda | |
| 6,459,039 B1 | 10/2002 | Bezama et al. | |
| 2002/0030261 A1 | 3/2002 | Rolda et al. | |

FOREIGN PATENT DOCUMENTS

| | | |
|---|---|---|
| KR | 2001036630 | 10/1999 |
| KR | 2002042958 | 12/2000 |

* cited by examiner

*Primary Examiner*—Nathan Flynn
*Assistant Examiner*—Fazli Erdem
(74) *Attorney, Agent, or Firm*—Rabin & Berdo, P.C.

(57) ABSTRACT

A semiconductor chip package is formed by a first semiconductor chip and a second semiconductor chip, which have electrodes for wiring at surfaces thereof, being integrated and mounted in a state in which reverse surfaces thereof oppose one another. Therefore, two semiconductor chips can be freely combined and mounted regardless of chip sizes thereof, and lengths of wires can be shortened. Thus, a wire-bonding yield can be improved, and a semiconductor package having excellent electric characteristics can be obtained.

10 Claims, 9 Drawing Sheets

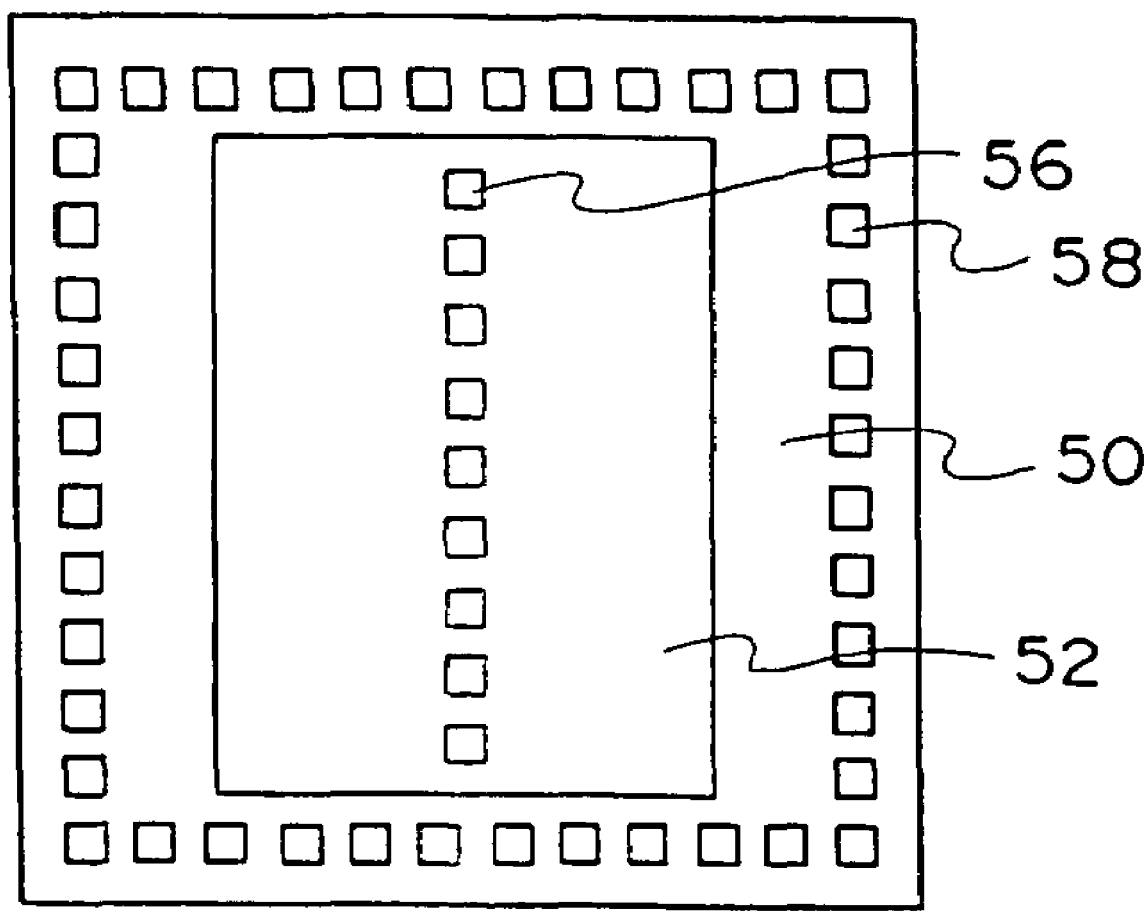

SEMICONDUCTOR CHIP PACKAGE

This is a Continuation of U.S. application Ser. No.: 09/912,064, filed Jul. 25, 2001.

BACKGROUND OF THE INVENTION

1. Field of the Invention

The present invention relates to a semiconductor chip package in which two semiconductor chips are integrated and mounted.

2. Description of the Related Art

Various conventional semiconductor chip packages in which two semiconductor chips are integrated and mounted have been proposed. One example thereof is the BGA (ball grid array) type semiconductor chip package whose cross-sectional structure is illustrated in FIG. 10.

In the case of the semiconductor package structure shown in FIG. 10, electrodes 58 for wiring are aligned on the center of the surface of an upper chip 52. An example of a structure using such an arrangement is a memory LSI. On the other hand, as shown in FIG. 12, electrodes 56 for wiring are aligned in vicinities of each side on the surface of a lower chip 50. An example of a structure using such an arrangement is a logic LSI such as a microcomputer or the like.

The upper chip 52 and the lower chip 50 have been diced and separated into desired sizes. The lower chip 50 is fixed onto a chip mounting position of an interposer 54 formed from a material such as tape or glass epoxy by an adhesive 66 such as an epoxy resin. The upper chip 52 is similarly fixed onto the lower chip 50 by an adhesive 18. FIG. 13 is a schematic plan view showing a state in which the upper and lower chips have been mounted.

Thereafter, the electrodes 58, 56 for wiring of the upper chip 52 and the lower chip 50, respectively, are wire bonded to inner leads 64 on the interposer 54 by wire materials 62, 60 such as metal wires or the like. Then, the structure is resin sealed by a resin sealing material 68 formed from an epoxy resin or the like by a transfer molding method or the like. Finally, solder balls 70 are mounted at outer lead portions of the reverse surface of the interposer, and packaging is completed.

However, this semiconductor chip package, in which two semiconductor chips are integrated and mounted, has the following problems. (1) As can be understood from FIGS. 10 and 13, when the upper chip is integrated on the lower chip, the electrodes for wiring of the lower chip are completely exposed. Further, the present structure cannot be used if the upper chip is not small enough to expose a portion of the surface of the lower chip of a surface area sufficient for carrying out wire bonding by wire materials. (2) The electrodes for wiring can be disposed either in the center of the upper chip or in the vicinities of the respective sides of the upper chip. However, at the lower chip, which must be larger than the upper chip, the electrodes for wiring must be aligned at vicinities of the respective sides, and cannot be aligned in the center. (3) When the electrodes for wiring of the upper chip are aligned in the center of the chip, the wires become long. Thus, problems arise in that there is the concern that short circuits may arise between the wires, and in that the yield is low.

SUMMARY OF THE INVENTION

The present invention overcomes all of the aforementioned problems of the conventional art, and has as objects the following. Namely, a first object of the present invention is to provide a semiconductor chip package in which it is possible to mount two semiconductor chips freely in combination without the chip sizes being restricted. A second object of the present invention is to provide a semiconductor chip package which can be designed such that the lengths of wires are short, and thus has a stable wire bonding yield and has excellent electric characteristics.

The above objects are achieved by the following means. Namely, the semiconductor chip package of the present invention comprises: a first semiconductor chip on whose surface an electrode for wiring is formed; and a second semiconductor chip on whose surface an electrode for wiring is formed, and which is integrated and mounted with the first semiconductor chip, wherein the first semiconductor chip and the second semiconductor chip are integrated and mounted with respective reverse surfaces of the first semiconductor chip and the second semiconductor chip opposing one another.

In the semiconductor chip package of the present invention, because the first semiconductor chip and the second semiconductor chip are integrated and mounted with the reverse surfaces thereof facing each other, the surfaces of the first semiconductor chip and the second semiconductor chip, at which surfaces the electrodes for wiring are provided, exist at respectively different surfaces. Therefore, two semiconductor chips, whose chip sizes, positions of electrodes for wiring, and the like are different or the same can be freely combined and mounted. Namely, there are no limitations on the types of the upper and lower chips. Further, at both of the upper and lower chips, the electrodes for wiring can be disposed at the chip edge peripheries. Even if the electrodes for wiring are aligned on the center of the chip, designing can be carried out such that the lengths of wires are short. Therefore, a stable wire-bonding yield can be obtained, and further, there are advantages with regard to the electrical characteristics, such as high speed signal transmission and the like.

In the semiconductor chip package of the present invention, specifically, the structures described in following <1> through <3> are suited for the structure in which the first semiconductor chip and the second semiconductor chip are integrated and mounted with the reverse surfaces thereof facing each other.

<1> A semiconductor chip package further comprising: an interposer in which a through hole is formed at a position corresponding to the electrode for wiring on the second semiconductor chip, wherein the second semiconductor chip is fixed to a surface of the interposer at a portion of the surface of the second semiconductor chip, and the reverse surface of the first semiconductor chip is fixed to the reverse surface of the second semiconductor chip, and the electrode for wiring on the second semiconductor chip is exposed at a reverse surface side of the interposer via the through hole.

<2> A semiconductor chip package further comprising: an interposer in which is formed a through hole which is larger than chip sizes of the first semiconductor chip and the second semiconductor chip; and an adhesive sheet which is a sheet-shaped adhesive material provided on a surface of the interposer so as to cover the through hole, wherein the reverse surface of the second semiconductor chip is fixed to a reverse surface of the adhesive sheet which is exposed via the through hole at an interposer reverse surface side, and the reverse surface of the first semiconductor chip is fixed to a surface of the adhesive sheet so as to oppose the reverse surface of the second semiconductor chip at a position at which the second semiconductor chip is fixed.

<3> A semiconductor chip package further comprising: an interposer in which is formed a through hole which is smaller than a chip size of the first semiconductor chip and larger than a chip size of the second semiconductor chip, wherein the first semiconductor chip is fixed to a surface of the interposer at a portion of the reverse surface of the first semiconductor chip, such that the through hole is covered, and the reverse surface of the second semiconductor chip is fixed to the reverse surface of the first semiconductor chip which is exposed at a reverse surface side of the interposer via the through hole.

In the semiconductor chip package of the present invention, it is suitable that the interposer has, at a reverse surface side thereof, a region which is sunken-in, and the through hole is provided at the sunken-in region. Because the reverse surface side of the interposer is sunken-in and the through hole is provided at the sunken-in region, in a case in which the through hole and the periphery thereof at the reverse surface of the interposer are sealed with a sealing resin material or the like, the sealing resin material is embedded in the sunken-in region, and the size of the projecting portion of the sealing portion which is exposed can be held in check. Therefore, for example, the sealing portion can be kept lower than the solder balls provided at the outer lead portions of the reverse surface of the interposer. Further, in a case in which the solder balls are provided, the mounting pitches thereof can be made small, and the diameters of the solder balls can be made small. Note that the sealing portion being low means that the portion projecting out with respect to the reverse surface of the interposer is low.

In the present invention, the size of the through hole of the interposer with respect to the chip sizes of the semiconductor chips (the first semiconductor chip and the second semiconductor chip) means the size of the opening of the through hole of the interposer with respect to the opposing surface of the semiconductor chip.

BRIEF DESCRIPTION OF THE DRAWINGS

FIG. 13 is a schematic plan view which illustrates a state in which the upper and lower chips are mounted in the conventional semiconductor chip package.

DETAILED DESCRIPTION OF THE PREFERRED EMBODIMENTS

Figure 1:
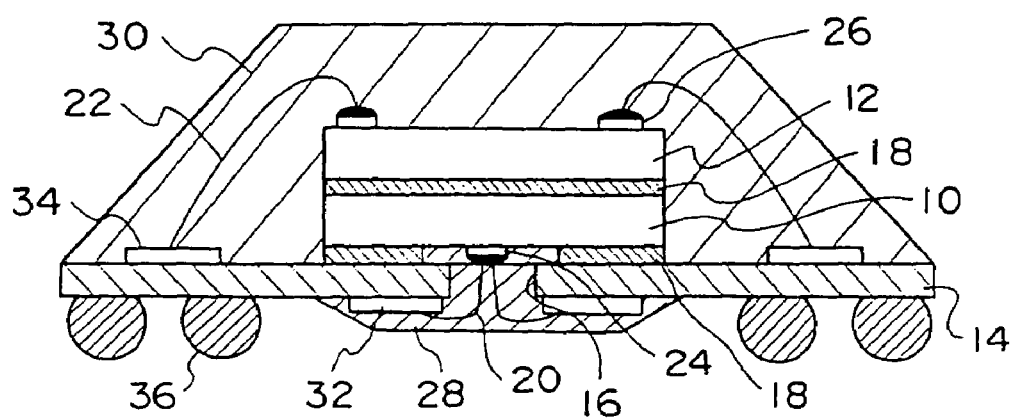
FIG. 1 is a schematic sectional view which illustrates a semiconductor chip package of a first embodiment.

Hereinafter, embodiments of the present invention will be described with reference to the drawings. Note that structures having substantially the same functions are described by being denoted by the same numerals throughout all of the drawings.

(First Embodiment)

A first embodiment will be described with reference to FIG. 1 through FIG. 5. Hereinafter, the structure of the semiconductor chip package illustrated in FIG. 1 will be described in accordance with the fabrication process thereof. In the semiconductor chip package illustrated in FIG. 1, a through hole 16 is formed in the center of an interposer 14 which is formed from a material such as tape, glass epoxy, or the like. The through hole 16 corresponds to electrodes 24 for wiring which are aligned at the center of the surface of a lower chip 10 (a second semiconductor chip). A semiconductor chip, which is diced and separated into a desired size and in which the electrodes 24 for wiring are aligned at the at the center of the surface thereof, is fixed, as the lower chip 10 (the second semiconductor chip), onto a chip mounting position of the surface of the interposer 14 in a state in which a desired portion of the surface of the lower chip 10 is adhered to the surface of the interposer 14 by an adhesive 18 such as epoxy resin or the like. At this time, the electrodes 24 for wiring formed on the surface of the lower chip 10 are exposed at the reverse surface side of the interposer 14 via the through hole.

Thereafter, the electrodes 24 for wiring of the lower chip 10 are wire-bonded to inner leads 32 which exist at the reverse surface of the interposer 14 by wiring members 20 such as metal wires or the like. Further, the respective members at the reverse surface side of the interposer 14 are resin-sealed with a resin sealing material 28 such as an epoxy resin or the like by a potting method or the like. Here, a case is described in which the sealing resin is exposed and projects out at the reverse surface of the interposer 14. However, the amount of projection of the sealing resin can be kept sufficiently lower than the solder balls and presents no problems.

Next, a semiconductor chip, which is diced and separated into a desired size and at which electrodes 26 for wiring are provided at the chip edge periphery of the surface thereof, is fixed, as an upper chip 12 (first semiconductor chip), on the lower chip 10 by the reverse surface of the upper chip 12 being adhered to the reverse surface of the lower chip 10 by the adhesive 18 such as epoxy resin or the like. Thereafter, electrodes 26 for wiring of the upper chip 12 are wire-bonded to inner leads 34, which exist on the interposer 14, by wiring members 22 such as metal wires or the like. Further, the respective members at the surface of the interposer 14 are resin-sealed by a resin sealing material 30 such as an epoxy resin or the like by a transfer molding method or the like. Finally, solder balls 36 are mounted on outer lead portions of the reverse surface of the interposer 14, and the semiconductor chip package is completed.

Figure 2:
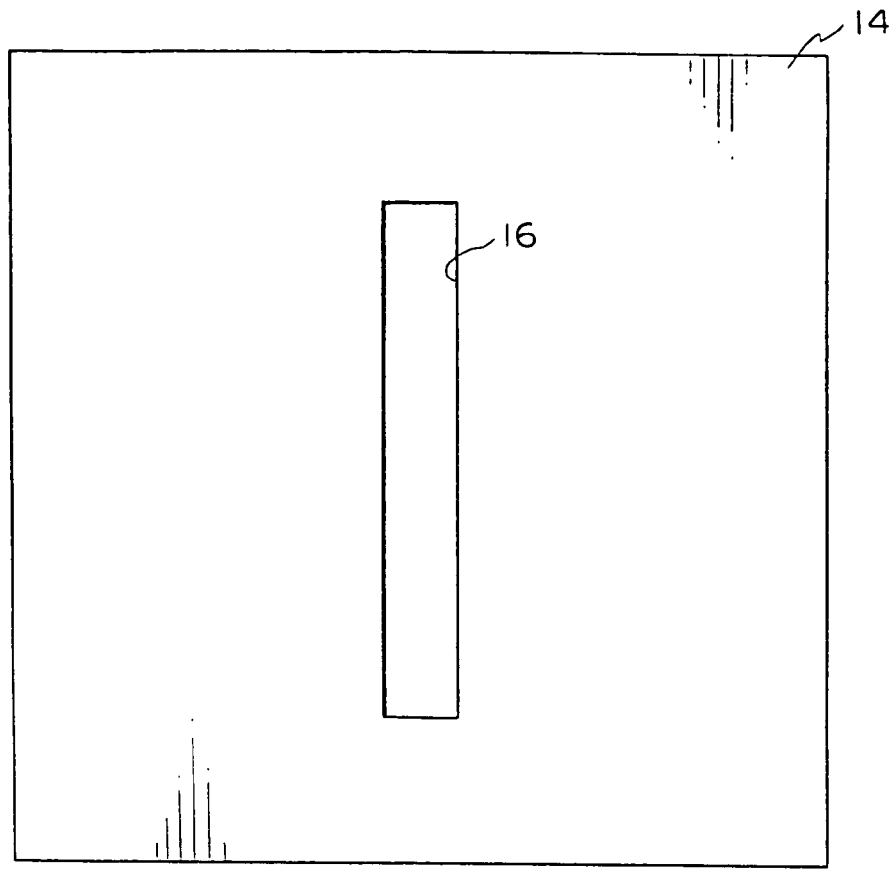
FIG. 2 is a schematic plan view which illustrates an interposer of the semiconductor chip package of the first embodiment.
Figure 3:
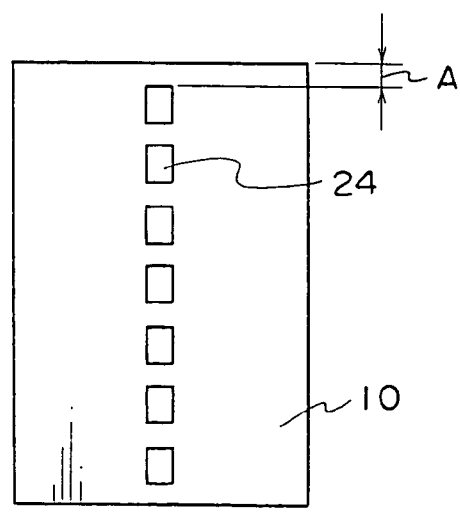
FIG. 3 is a schematic plan view which illustrates a lower chip of the semiconductor chip package of the first embodiment.
Figure 4:
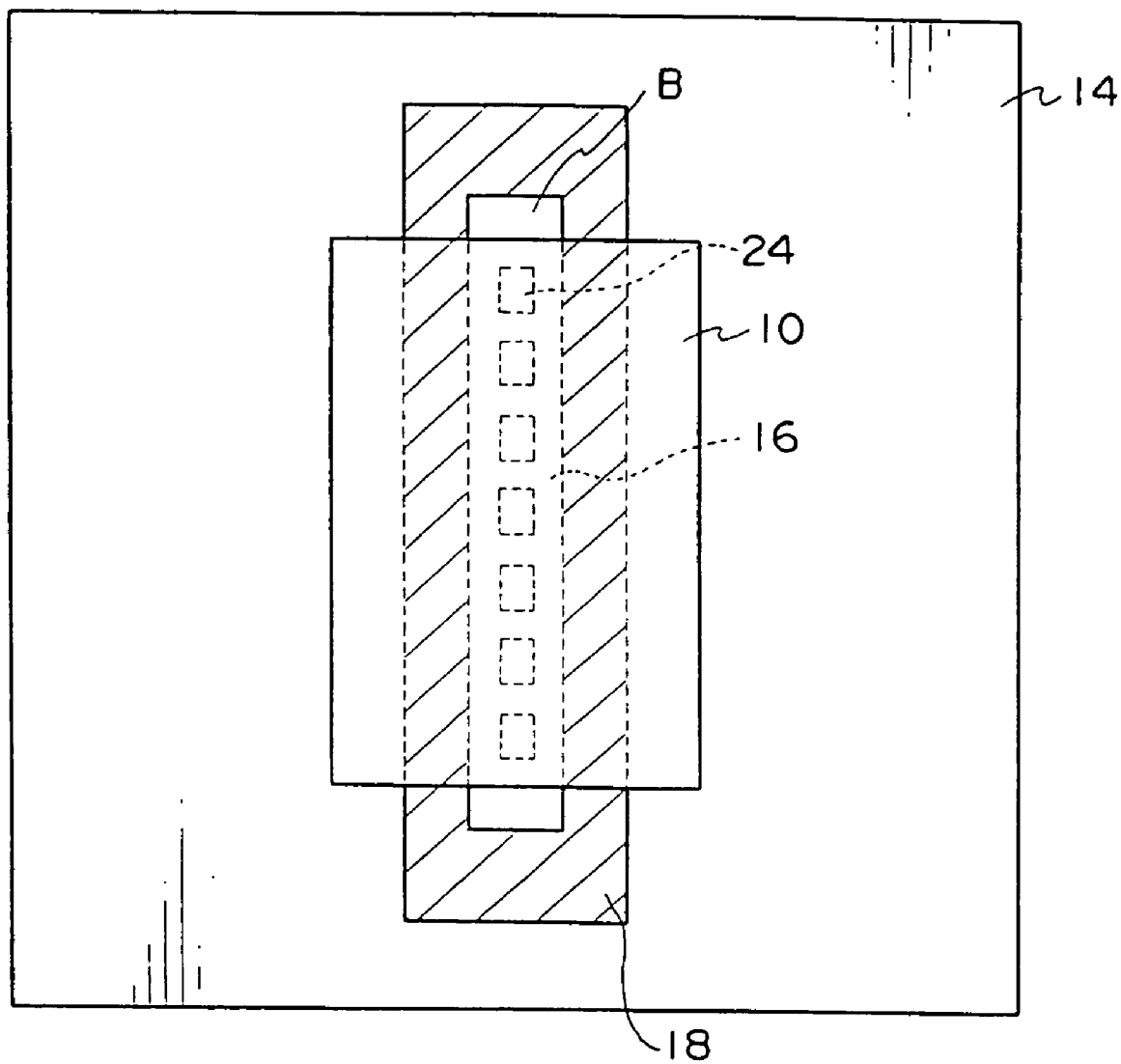
FIG. 4 is a schematic plan view which illustrates a fixed state of the lower chip of the semiconductor chip package of the first embodiment.

In the first embodiment, as shown in FIG. 2, the through hole 16 is provided at a position, at the center of the interposer 14, which position corresponds to the electrodes 24 for wiring aligned at the center of the lower chip 10. Here, as shown in FIG. 3, usually, a distance A from the electrodes 24 for wiring aligned at the center of the lower chip 10 to a chip edge is extremely short, for example, about 100 µm. In this case, in order to ensure to a certain extent the distance between the edge of the through hole 16 of the interposer 14 and the electrodes 24 for wiring, as shown in FIG. 4, the lower chip 10 is fixed onto a chip mounting position at the surface of the interposer 14 by the adhesive 18 (the range of application of the adhesive is shown by the hatched portion in FIG. 4), with a space B being provided such that the lower chip 10 does not completely cover the through hole 16. If the respective members at the reverse surface of the interposer 14 are resin-sealed by the resin sealing material 28 in this state, there is a problem in that resin leaks out from the space B.

Figure 5:
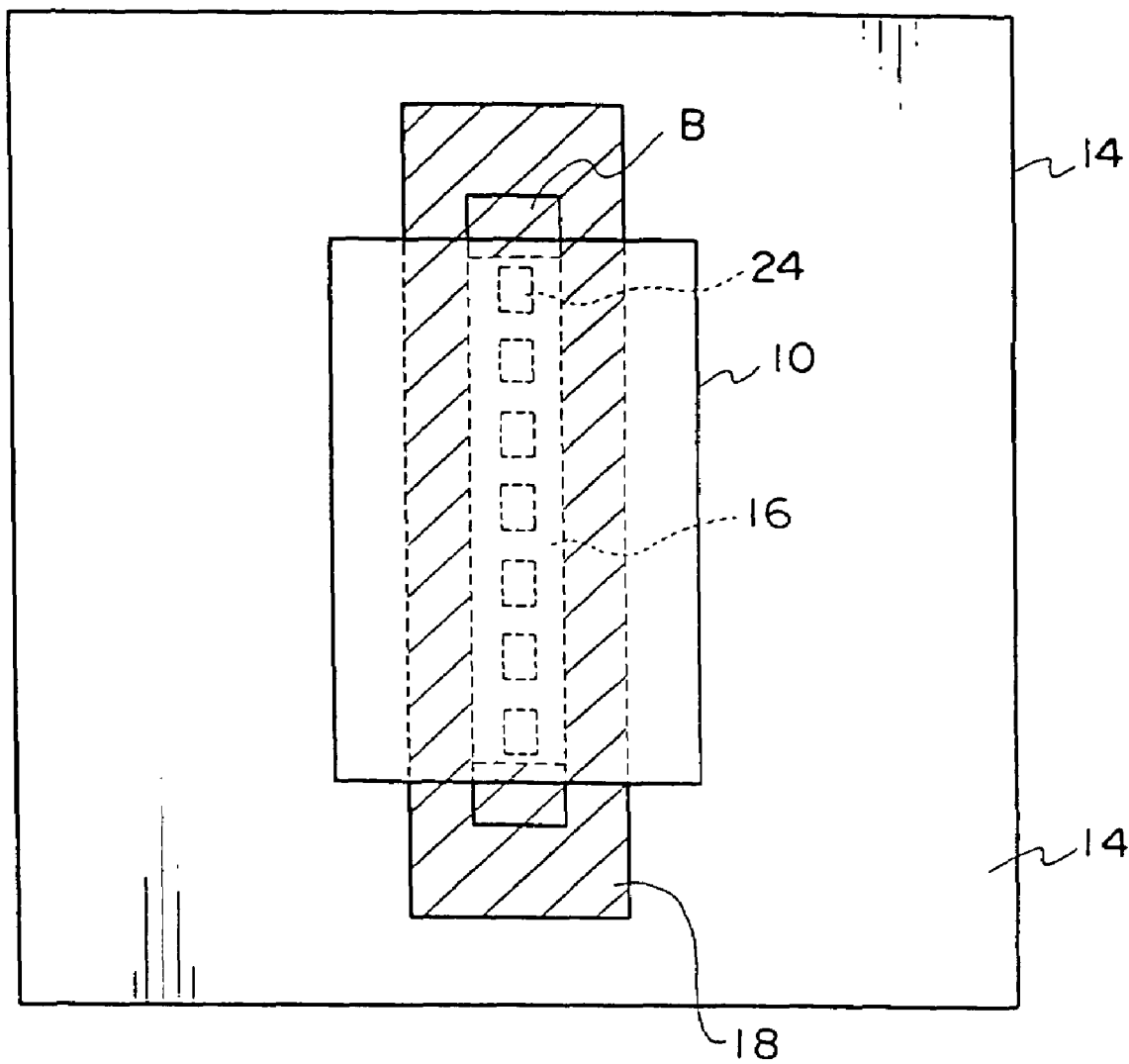
FIG. 5 is a schematic plan view which illustrates a suitable fixed state of the lower chip of the semiconductor chip package of the first embodiment.

Thus, as shown in FIG. 5, preferably, the sheet-shaped adhesive 18 has the property that, due to heating, both surfaces thereof become viscous (such as a thermoplastic resin), and can fix (adhere) an object to be adhered. Further, the sheet-shaped adhesive 18 is preferably a size larger than the chip size of the lower chip 10, and is a size which covers the space between the lower chip 10 and the through hole 16. (Preferably, the sheet-shaped adhesive 18 is of a size which, at the long diameter direction of the through hole 16, is about 100 μm longer at each side than the other direction.) Preferably, a portion of the surface of the lower chip 10 is temporarily adhered to the sheet-shaped adhesive 18, and then, the surface of the lower chip 10 is fixed to the chip mounting position of the surface of the interposer 14 by the sheet-shaped adhesive 18. A small hole, which corresponds to the electrodes 24 for wiring at the surface of the lower chip 10 and which is smaller than the chip size of the lower chip 10, is provided in the sheet-shaped adhesive 18. In this way, the through hole 16 of the interposer 14 can be completely covered by the lower chip 10 and the sheet-shaped adhesive 18, and leakage of resin at the time of resin sealing can be prevented.

In the first embodiment, a desired portion of the surface of the lower chip 10 is fixed onto the chip mounting position of the surface of the interposer 14 by the adhesive 18, and the reverse surface of the upper chip 12 is fixed onto the reverse surface of the lower chip 10 by the adhesive 18. Namely, the electrodes 26, 24 for wiring, which are provided at the upper chip 12 and the lower chip 10 respectively, exist at opposite surfaces of the structure formed by the upper chip and the lower chip. Therefore, the upper chip 12, which is the same size as the lower chip 10 or is larger than the chip size of the lower chip 10, can be mounted.

In the first embodiment, the through hole 16 is provided in the interposer 14, and the lower chip 10 and the inner leads 32 at the reverse surface of the interposer 14 are wire-bonded through the through hole 16. Further, the upper chip 12, at which the electrodes 26 for wiring are disposed at the chip edge periphery, can be used. Therefore, the lengths of the wiring members (wires) can be shortened. Therefore, a stable wire-bonding yield can be obtained, and further, there are advantages with regard to the electrical characteristics, such as high speed signal transmission and the like.

(Second Embodiment)

Figure 6:
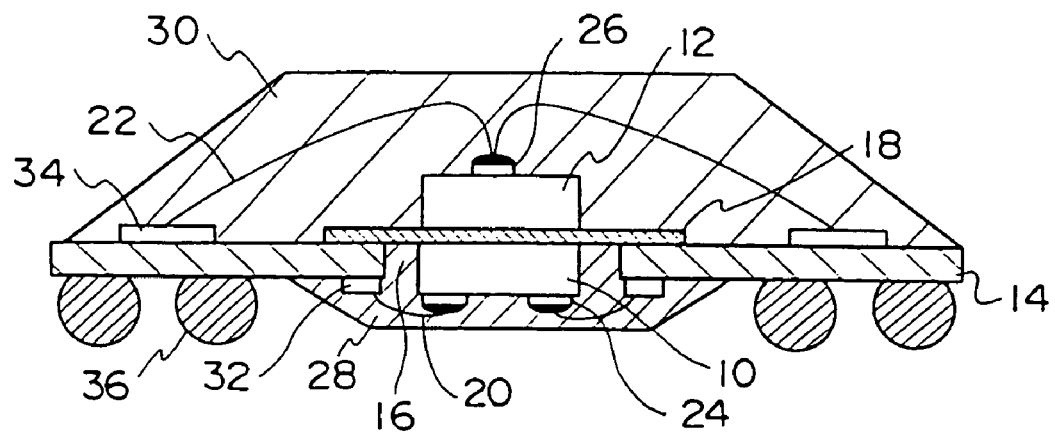
FIG. 6 is a schematic sectional view which illustrates a semiconductor chip package of a second embodiment.

A second embodiment will be described with reference to FIG. 6. Hereinafter, the structure of the semiconductor chip package shown in FIG. 6 will be described in accordance with the fabrication process thereof. In the semiconductor chip package shown in FIG. 6, the through hole 16, which is a size larger (preferably, about 0.2 mm larger at one side) than the chip size of the upper chip 12 (the first semiconductor chip) and the lower chip 10 (the second semiconductor chip), is provided at the center of the interposer 14 which is formed by a material such as tape or glass epoxy or the like. The sheet-shaped adhesive 18, which has the property such as that of a thermoplastic resin that when the adhesive 18 is heated, both surfaces thereof become viscous and can be adhered, is temporarily adhered to the surface of the interposer 14. At this time, if the sheet-shaped adhesive 18 is designed as to be larger than the through hole 16 by about 100 μm at each side thereof, the through hole 16 is completely covered, and therefore, resin leakage can be prevented at the time of sealing.

The semiconductor chip, which is diced and separated into a desired size and at which the electrodes 24 for wiring are provided at the chip edge periphery of the surface thereof, serves as the lower chip 10, and the surface of the lower chip 10 is fixed to the reverse surface of the sheet-shaped adhesive 18 at which the reverse surface of the lower chip 10 is exposed from the through hole 16 so as to oppose the reverse surface side of the interposer 14. Thereafter, the electrodes 24 for wiring of the lower chip 10 are wire-bonded with the inner leads 32 which exist at the reverse surface of the interposer 14 by the wiring members 20 which are metal wires or the like. Then, the respective members of the reverse surface of the interposer 14 are resin-sealed by the resin sealing material 28 such as an epoxy resin or the like by the transfer molding method or the like.

A semiconductor chip, which is diced and separated into a desired size and at which the electrodes 26 for wiring are provided at the center of the surface thereof, serves as the upper chip 12, and the reverse surface of the upper chip 12 is fixed to the surface of the sheet-shaped adhesive 18 so as to face the mounting position of the lower chip 10. Thereafter, the electrodes 26 for wiring of the upper chip 12 are wire-bonded to the inner leads 34 which exist at the surface of the interposer 14 by the wiring members 22 which are metal wires or the like. Then, the respective members of the surface of the interposer 14 are resin-sealed by the resin sealing material 30 such as a epoxy resin or the like by the transfer molding method or the like. Finally, the solder balls 36 are mounted to outer lead portions at the reverse surface of the interposer 14, and the semiconductor chip package is completed.

In the second embodiment, the surface of the lower chip 10 is fixed to the reverse surface of the sheet-shaped adhesive 18 such that the reverse surface of the lower chip 10 is exposed from the through hole 16 so as to oppose the reverse surface side of the interposer 14. The reverse surface of the upper chip 12 is fixed to the surface of the sheet-shaped adhesive 18 so as to oppose the position at which the lower chip 10 is fixed. Namely, the surfaces of the upper chip 12 and the lower chip 10, at which the electrodes 26, 24 for wiring are provided respectively, exist at the surfaces at opposite sides of the structure formed by the upper chip and the lower chip. Therefore, the upper chip 12, which is the same chip size or a greater chip size than the lower chip 10, can be mounted.

In the second embodiment, the lower chip 10 is provided within the through hole 16 provided at the interposer 14, and the electrodes 24 for wiring of the lower chip 10 and the inner leads 32 at the reverse surface of the interposer 14 are wire-bonded. Further, because the lower chip 10 is provided within the through hole 16 provided at the interposer 14, the height at which the upper chip 12 is disposed with respect to the interposer 14 can be kept low. Therefore, the lengths of the wiring members (wires) can be shortened. Accordingly, a stable wire-bonding yield can be obtained, and further, there are advantages with regard to the electrical characteristics, such as high speed signal transmission and the like.

(Third Embodiment)

Figure 7:
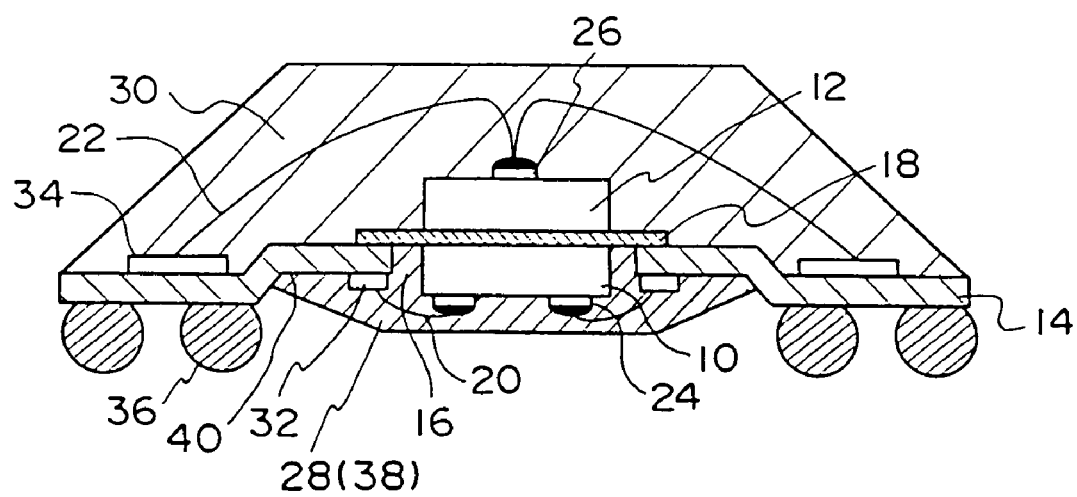
FIG. 7 is a schematic sectional view which illustrates a semiconductor chip package of a third embodiment.

A third embodiment will be described with reference to FIG. 7. Hereinafter, the structure of the semiconductor chip package shown in FIG. 7 will be described in accordance with the fabrication process thereof. In the semiconductor chip package shown in FIG. 7, a metal substrate of aluminum or the like is used as the interposer 14, and the reverse side thereof is sunken-in by drawing or the like, such that the through hole 16 is provided at a sunken-in region 38. Other than this structure, the present third embodiment is the same as the above-described second embodiment, and therefore, description thereof will be omitted.

In the third embodiment, the semiconductor chip package includes the interposer 14 whose reverse surface side is sunken-in, and the through hole 16 is provided at the sunken-in region 38. Usually, in the case of a structure such as that of the above-described third embodiment, if the chip thickness of the lower chip 10 is large, because the portion sealed by the sealing resin projects out at the reverse surface of the interposer 14, it is difficult for a sealed portion 40 to be kept sufficiently lower than the solder balls 36. More concretely, if the number of pins increases, the mounting pitches of the solder balls 36 are small, and in order to address this, the diameters of the solder balls 36 must be of necessity be made small. Accordingly, the height of the solder ball 36 is made low. On the other hand, if the chip thickness of the lower chip 10 is sufficiently low (for example, about 100 µm), the height of the sealed portion can be kept sufficiently lower than the height of the solder balls 36. However, in a case in which the height of the solder balls 36 is low (generally, about 300 µm or less), the above-described third embodiment cannot be utilized. Therefore, by structuring the interposer 14 as described above, even if the through hole and the periphery thereof (the periphery of the respective members at the surface of the interposer 14) are sealed by a sealing resin material or the like, because the sealing resin material is embedded in the depressed region 38 of the interposer 14, the projecting of the sealed portion can be kept sufficiently lower than the height of the solder balls 36. Further, if the mounting pitches of the solder balls 36 are small, the diameters of the solder balls can be kept small.

(Fourth Embodiment)

Figure 8:
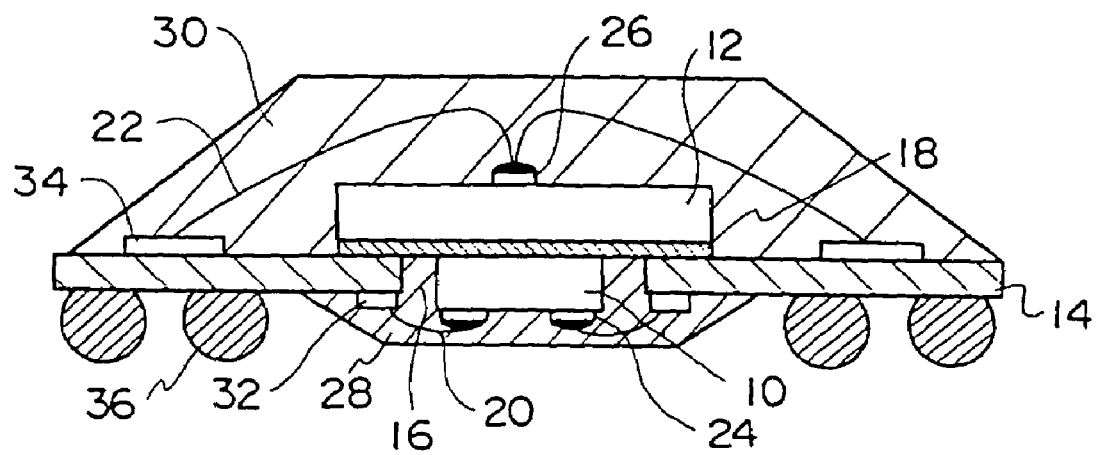
FIG. 8 is a schematic sectional view which illustrates a semiconductor chip package of a fourth embodiment.

A fourth embodiment will be described with reference to FIG. 8. Hereinafter, the structure of the semiconductor chip package shown in FIG. 8 will be described in accordance with the fabrication process thereof. In the semiconductor chip package shown in FIG. 8, the through hole, which is a size smaller than the chip size of the upper chip 12 (the first semiconductor chip) mounted on the surface of the interposer 14 and which is larger than the chip size of the lower chip 10 (the second semiconductor chip), is provided at the center of the interposer 14 which is formed by tape, glass epoxy, or the like. Further, a semiconductor chip, which is diced and separated to a desired size and at which the electrodes 26 for wiring are provided at the center of the surface, serves as the upper chip 12. The sheet-shaped adhesive 18, such as a thermoplastic resin, which has the property that, when heated, both sides thereof become viscous and can adhere, is temporarily adhered to the reverse surface of the upper chip 12. Portions of the reverse surface of the upper chip 12 are fixed to overhanging regions of the interposer 14 at the periphery of the through hole 16 by the sheet-shaped adhesive 18 which is temporarily adhered in advance to the reverse surface of the upper chip 12. Thereafter, the electrodes 26 for wiring of the upper chip 12 are wire-bonded with the inner leads 34 which exist on the surface of the interposer 14 by the wiring members 20 such as metal wires or the like. Then, the respective members at the surface of the interposer 14 are resin-sealed with the resin sealing material 30 such as an epoxy resin or the like by the transfer molding method or the like. At this time, if the upper chip 12 is designed to be larger than the through hole 16, for example, the respective sides of the upper chip 12 are each about 0.2 µm longer than the sides of the through hole 16, the through hole 16 can be completely covered, and thus, resin leakage can be prevented at the time of sealing.

The semiconductor chip, which is diced and separated to a desired size and at which the electrodes 24 for wiring are provided at the chip edge periphery of the surface, serves as the lower chip 10. Next, the reverse surface of the lower chip 10 is fixed by the adhesive 18 to the reverse surface of the upper chip 12 at which the reverse surface of the lower chip 10 is exposed from the through hole 16 so as to oppose the reverse surface side of the interposer 14. Thereafter, the electrodes 24 for wiring of the lower chip 10 are wire-bonded to the inner leads 32 which exist at the reverse surface of the interposer 14 by the wiring members 20 such as metal wires or the like. Then, the respective members at the reverse surface of the interposer 14 are resin-sealed by the resin sealing material 28 such as epoxy resin or the like by the transfer molding method or the like. Finally, the solder balls 36 are mounted to the outer lead portions at the reverse surface of the interposer 14, and the semiconductor chip package is completed.

In the fourth embodiment, the upper chip 12 is fixed such that a portion of the reverse surface thereof covers the through hole 16 at the surface of the interposer 14, and the surface of the lower chip 10 is fixed to the reverse surface of the upper chip 12 which is exposed from the through hole 16 at the reverse surface side of the interposer 14. Namely, the surfaces of the upper chip 12 and the lower chip 10, at which the electrodes 26, 24 for wiring are provided respectively, exist at opposite sides of the structure formed by the upper chip and the lower chip. In accordance with this structure, the upper chip 12, whose chip size is larger than that of the lower chip 10, can be mounted.

In the fourth embodiment, the lower chip 10 is provided within the through hole 16 provided in the interposer 14, and the electrodes 24 for wiring of the lower chip 10 and the inner leads 32 at the reverse surface of the interposer 14 are wire-bonded. Further, because the lower chip 10 is provided within the through hole 16 of the interposer 14, the amount of projection of the upper chip 12 with respect to the interposer 14 can be kept low. Therefore, the lengths of the wiring members (wires) can be shortened. Accordingly, a stable wire-bonding yield can be obtained, and there are advantages with regard to the electrical characteristics, such as high speed signal transmission and the like.

(Fifth Embodiment)

Figure 9:
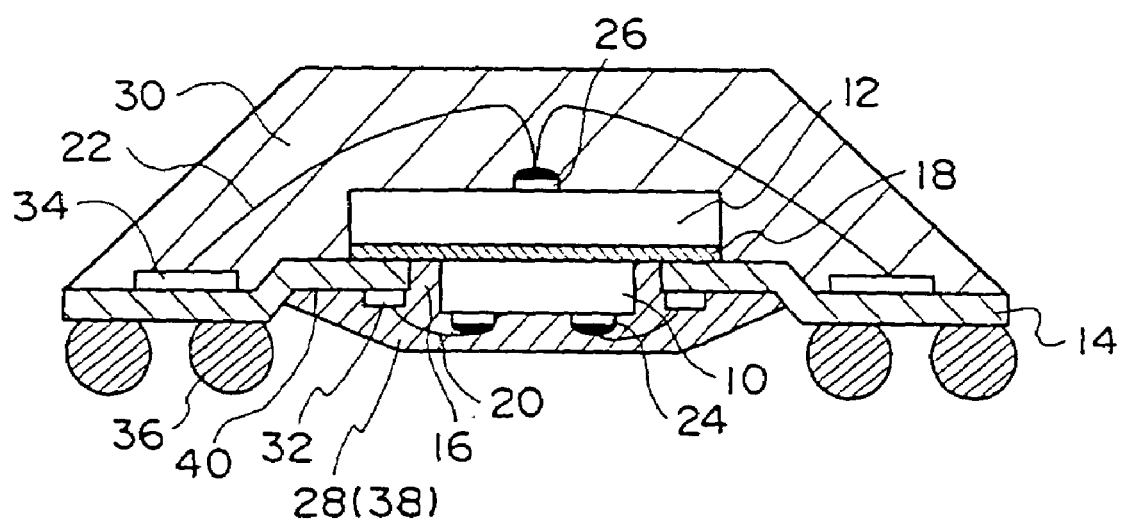
FIG. 9 is a schematic sectional view which illustrates a semiconductor chip package of a fifth embodiment.
Figure 10:
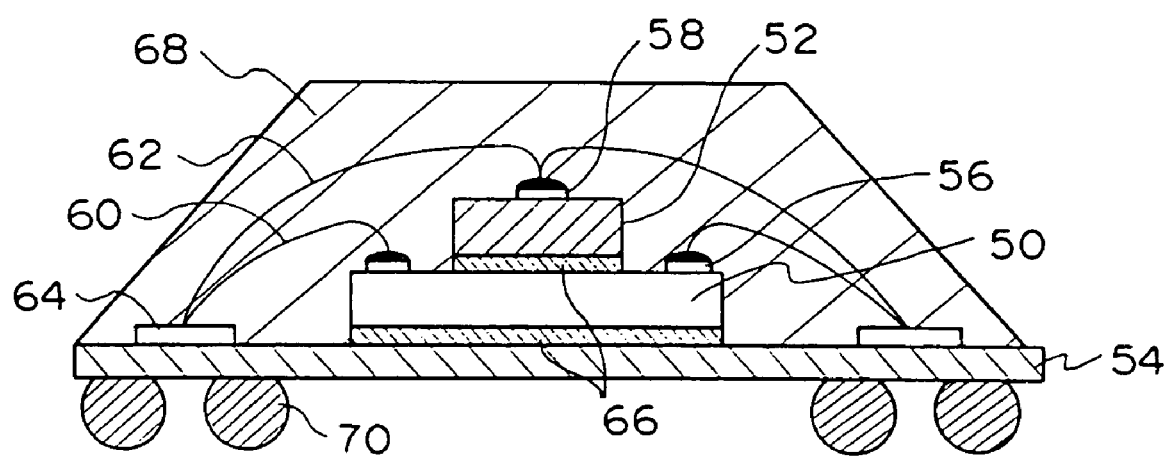
FIG. 10 is a schematic sectional view which illustrates a conventional semiconductor chip package.
Figure 11:
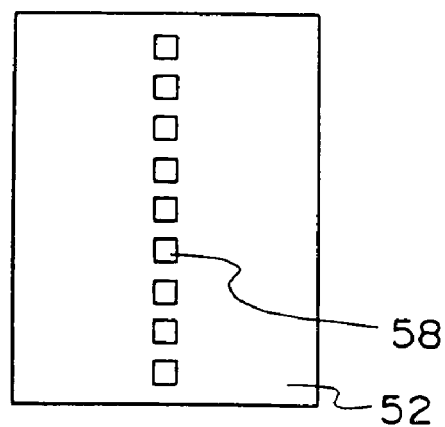
FIG. 11 is a schematic plan view which illustrates an upper chip of the conventional semiconductor chip package.
Figure 12:
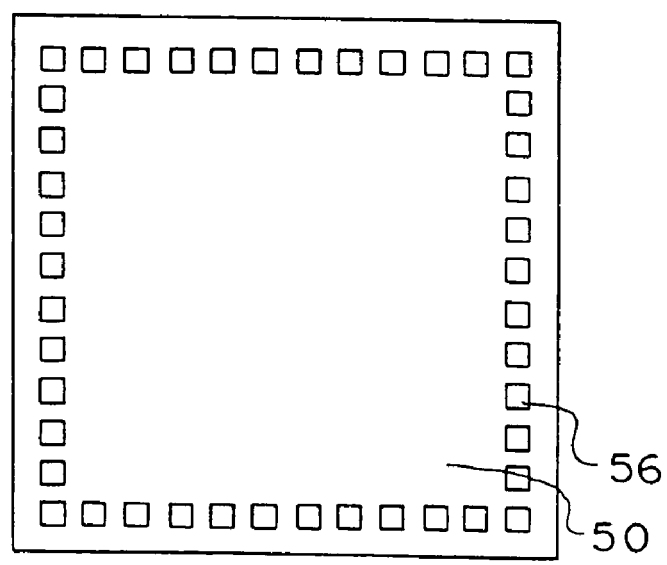
FIG. 12 is a schematic plan view which illustrates a lower chip of the conventional semiconductor chip package.

A fifth embodiment will be described with reference to FIG. 9. The structure of the semiconductor chip package shown in FIG. 9 will be described in accordance with the fabrication process thereof. In the semiconductor chip package shown in FIG. 9, the interposer 14 is a structure which uses a metal substrate of aluminum or the like, and whose reverse surface side is sunken-in by drawing or the like, and the through hole 16 is provided at the depressed region 38. Except for this structure, the fifth embodiment is the same as the above-described fourth embodiment, and description will be omitted.

In the fifth embodiment, the semiconductor chip package includes the interposer 14 whose reverse surface side is sunken-in, and the through hole 16 is provided at the depressed region. Thus, as in the above-described third embodiment, the projecting of the sealed portion can be kept sufficiently lower than the height of the solder balls 36. Further, the mounting pitches of the solder balls 36 can be made to be small, and the diameters of the solder balls 36 can be made to be small.

In above-described first through fifth embodiments, the structures are described in accordance with the fabrication processes thereof, but it is needless to say that the present invention is not limited to these fabrication processes. Further, in the above-described first through fifth embodiments, the terms "upper" and "lower" of the upper chip and the lower chip mean upper and lower in so far as their positions with respect to surfaces of the interposer.

In the first through fifth embodiments which are described above, cases in which the positions of the electrodes for wiring on the upper chip and the lower chip are at the center or at the periphery of the chip edge are described. However, in the present invention, the positions of the electrodes for wiring are not particularly limited to these positions, and semiconductor chips in which electrodes for wiring are provided at any positions can be mounted.

In the above-described first through third embodiments, cases in which the chip sizes of the upper chip and the lower chip are the same are described. However, the chip sizes of the upper chip and the lower chip can be freely changed, and the chips can be mounted with any combinations of chip sizes.

The semiconductor chip packages of the present invention relating to the above-described embodiments are not to be interpreted as limiting, and can be realized within a scope satisfying the structural conditions of the present invention.

What is claimed is:

1. A semiconductor chip package comprising:
  a first integrated semiconductor chip having a one side and a reverse side, and having a first electrode for wiring on the one side of the first integrated semiconductor chip;
  a nonconductive interposer substrate having opposite first and second surfaces, and having a through-hole extending therethrough from the first surface to the second surface; and
  a second integrated semiconductor chip having a one side and a reverse side, and having a second electrode for wiring on the one side of the second integrated semiconductor chip, the second integrated semiconductor chip being mounted on the first surface of the interposer substrate with the one side of the second integrated semiconductor chip facing the first surface of the interposer substrate, such that the second electrode is exposed through the through-hole, the second electrode to be wired through the through-hole to external terminals on the second surface of the interposer substrate,
  the first integrated semiconductor chip being mounted on the reverse side of the second integrated semiconductor chip with the reverse side of the first integrated semiconductor chip facing the reverse side of the second integrated semiconductor chip,
  wherein the through hole extending through the interposer substrate has a first width in a first direction and a second width in a second direction perpendicular to the first direction, and wherein the first width is smaller than both a width of the first semiconductor chip in the first direction and a width of the second semiconductor chip in the first direction.

2. A semiconductor chip package comprising:
  a first integrated semiconductor chip having a first chip size, having a one side and a reverse side, and having a first electrode for wiring on the one side of the first integrated semiconductor chip;
  a second integrated semiconductor chip having a second chip size and having a one side and a reverse side, the first integrated semiconductor chip being mounted to the second integrated semiconductor chip with the reverse side of the second integrated semiconductor chip facing the reverse side of the first integrated semiconductor chip; and
  an interposer substrate having a through-hole, the through-hole being smaller than the first chip size and larger than the second chip size,
  wherein a portion of the reverse side of the first integrated semiconductor chip is fixed to the first surface of the interposer substrate via an adhesive sheet that is disposed on the entire reverse side of the first integrated semiconductor chip, such that the through-hole is covered by the first integrated semiconductor chip and the adhesive sheet,
  wherein the reverse side of the second integrated semiconductor chip is fixed to the reverse side of the first integrated semiconductor chip via the adhesive sheet on the reverse side of the first integrated semiconductor chip, such that a portion of the adhesive sheet is exposed through the through-hole from a side of the interposer substrate at the second surface of the interposer substrate.

3. A semiconductor chip package according to claim 1, wherein the interposer substrate has a sunken region, that is sunken into the side of the interposer substrate at the second surface of the interposer substrate, and the through-hole is provided through the sunken region.

4. A semiconductor chip package according to claim 2, wherein the interposer substrate has a sunken region, that is sunken into the side of the interposer substrate at the second surface of the interposer substrate, and the through-hole is provided through the sunken region.

5. A semiconductor chip package according to claim 1, wherein the interposer substrate is formed of one of nonconductive tape and a glass epoxy material.

6. A semiconductor chip package according to claim 2, wherein the interposer substrate is formed of one of nonconductive tape and a glass epoxy material.

7. A semiconductor chip package according to claim 2, wherein the interposer substrate has external terminals on its second surface to which the second electrode can be wired, and external terminals on its first surface to which the first electrode can be wired.

8. A semiconductor chip package according to claim 7, further comprising:
  a plurality of solder balls mounted to the second surface of the interposer substrate, the solder balls being electrically connected to respective ones of the external terminals on the first and second surfaces of the interposer substrate.

9. A semiconductor chip package according to claim 1, wherein the interposer substrate has external terminals on its first surface to which the first electrode can be wired.

10. A semiconductor chip package according to claim 9, further comprising:
  a plurality of solder balls mounted to the second surface of the interposer substrate, the solder balls being electrically connected to respective ones of the external terminals on the first and second surfaces of the interposer substrate.

* * * * *